United States Patent
Kim

(10) Patent No.: US 9,111,633 B2
(45) Date of Patent: Aug. 18, 2015

(54) SEMICONDUCTOR MEMORY DEVICE HAVING SUB WORD LINE DRIVER AND DRIVING METHOD THEREOF

(71) Applicant: Samsung Electronics Co., Ltd., Suwon-si (KR)

(72) Inventor: Hyun-Ki Kim, Yongin-si (KR)

(73) Assignee: SAMSUNG ELECTRONICS CO., LTD., Samsung-ro, Yeongtong-gu, Suwon-si, Gyeonggi-do (KR)

( * ) Notice: Subject to any disclaimer, the term of this patent is extended or adjusted under 35 U.S.C. 154(b) by 0 days.

(21) Appl. No.: 14/198,874

(22) Filed: Mar. 6, 2014

(65) Prior Publication Data

US 2014/0347951 A1    Nov. 27, 2014

(30) Foreign Application Priority Data

May 21, 2013    (KR) .................. 10-2013-0057255

(51) Int. Cl.
| | | |
|---|---|---|
| *G11C 8/08* | (2006.01) | |
| *G11C 11/408* | (2006.01) | |
| *G11C 7/02* | (2006.01) | |
| *G11C 8/14* | (2006.01) | |
| *G11C 29/02* | (2006.01) | |
| *G11C 11/406* | (2006.01) | |
| *G11C 8/00* | (2006.01) | |
| *G11C 29/12* | (2006.01) | |

(52) U.S. Cl.
CPC ............. *G11C 11/4085* (2013.01); *G11C 7/02* (2013.01); *G11C 8/08* (2013.01); *G11C 8/14* (2013.01); *G11C 29/021* (2013.01); *G11C 29/025* (2013.01); *G11C 29/028* (2013.01); *G11C 8/00* (2013.01); *G11C 11/406* (2013.01); *G11C 2029/1202* (2013.01)

(58) Field of Classification Search
CPC .................................................. G11C 11/4085
USPC .................................................. 365/230.06
See application file for complete search history.

(56) References Cited

U.S. PATENT DOCUMENTS

| | | | | |
|---|---|---|---|---|
| 5,319,605 | A | * | 6/1994 | Min et al. ............... 365/230.06 |
| 5,812,483 | A | | 9/1998 | Jeon et al. |
| 6,069,838 | A | | 5/2000 | Jeong |
| 6,091,620 | A | * | 7/2000 | Kablanian ..................... 365/63 |
| 6,118,722 | A | | 9/2000 | Jeon et al. |
| 6,240,039 | B1 | * | 5/2001 | Lee et al. ............... 365/230.06 |
| 7,898,898 | B2 | | 3/2011 | Na |
| 2006/0092750 | A1 | | 5/2006 | Jeon et al. |

FOREIGN PATENT DOCUMENTS

| | | |
|---|---|---|
| KR | 10-1997-0029785 | 6/1997 |
| KR | 10-1997-0029810 | 6/1997 |

(Continued)

*Primary Examiner* — Son Mai
(74) *Attorney, Agent, or Firm* — Muir Patent Law, PLLC

(57) ABSTRACT

A semiconductor memory device may include a memory cell array, a plurality of first sub word line drivers, and a plurality of second sub word line drivers. The memory cell array may comprise a plurality of sub cell arrays, a plurality of first word lines and a plurality of second word lines, wherein a loading of each of the first word lines is greater than a loading of each of the second word lines. Each of the plurality of first sub word line drivers may be connected to drive a corresponding one of the plurality of first word lines, wherein each of the first sub word line drivers has a first driving capability. Each of the plurality of second sub word line drivers may be connected to drive a corresponding one of the plurality of second word lines, wherein each of the second sub word line drivers has a second driving capability different from the first driving capability.

20 Claims, 17 Drawing Sheets

(56) References Cited

FOREIGN PATENT DOCUMENTS

| KR | 10-1997-0051136 | | 7/1997 |
|----|----|----|----|
| KR | 10-2000-0038795 | A | 7/2000 |
| KR | 10-2001-0003913 | A | 1/2001 |
| KR | 10-0558561 | B1 | 3/2006 |
| KR | 10-2007-0077878 | A | 7/2007 |
| KR | 10-2009-0006435 | A | 1/2009 |
| KR | 10-2009-0036437 | A | 4/2009 |
| KR | 10-2009-0059677 | A | 6/2009 |
| KR | 10-2009-0099866 | A | 9/2009 |

* cited by examiner

SEMICONDUCTOR MEMORY DEVICE HAVING SUB WORD LINE DRIVER AND DRIVING METHOD THEREOF

CROSS-REFERENCE TO RELATED APPLICATIONS

This U.S. non-provisional patent application claims priority under 35 U.S.C. §119 to Korean Patent Application No. 10-2013-0057255, filed on May 21, 2013, the entire contents of which are hereby incorporated by reference.

BACKGROUND

Embodiments of the present disclosure relate to a semiconductor memory field, and more particularly, to a semiconductor memory device having a sub word line driver and a driving method thereof.

Volatile semiconductor memory devices such as a dynamic random access memory (DRAM) may generally access by a memory controller to perform a read operation or a write operation.

As DRAM manufacturing processes shrink, the space between word lines selecting the row direction of memory cells also narrows. Thus, a further process shrink is facing a physical scaling limit.

As the distance between an accessed word line and word lines adjacent thereto becomes close, a coupling effect increases. Thus, a fluctuation in threshold voltage of an access transistor that configures a memory cell may become serious and ground noise increases. In this case, the dynamic refresh operation characteristic of the DRAM becomes weak. Accordingly, it is desired to reduce noise resulting from activating a word line.

SUMMARY

The present disclosure provides a semiconductor memory device having a sub word line driver that may improve the dynamic refresh characteristic of a semiconductor memory device, and a driving method thereof.

Embodiments of the disclosure provide a semiconductor memory device including a memory cell array comprising a plurality of sub cell arrays, a plurality of first word lines and a plurality of second word lines, wherein a loading of each of the first word lines is greater than a loading of each of the second word lines; a plurality of first sub word line drivers, each connected to drive a corresponding one of the plurality of first word lines, wherein each of the first sub word line drivers has a first driving capability; and a plurality of second sub word line drivers, each connected to drive a corresponding one of the plurality of second word lines, wherein each of the second sub word line drivers has a second driving capability different from the first driving capability.

In some embodiments, the second driving capability is less than the first driving capability.

In other embodiments, each of the second group of sub word line drivers may be placed at an upper or lower edge of the memory cell array.

In still other embodiments, each of the first sub word line drivers may be placed between two consecutive sub cell arrays of the memory cell array.

In even other embodiments, each of the first and second sub word line drivers includes a MOS transistor having a source/drain connected to a corresponding word line. A width of the MOS transistor of each second sub word line driver may be less than a width of the MOS transistor of each first sub word line driver.

In yet other embodiments, each of the first and second sub word line drivers includes a MOS transistor having a source/drain connected to a corresponding word line. The MOS transistor of each of the first sub word line drivers has a first number of fingers and MOS transistor of each of the second sub word line drivers have a second number of fingers, wherein the second number is less than the first number.

In further embodiments, each of the first and second sub word line drivers includes a MOS transistor configured to drive a corresponding word line and comprising a source/drain connected to a contact. A size of the contact connected to the MOS transistor of each of the second sub word line driver may be smaller than a size of the contact connected to the MOS transistor of each of the first sub word line drivers.

In still further embodiments, each of the first sub word line drivers includes a MOS transistor configured to drive a corresponding word line and comprising a source/drain connected to a first number of contacts. Each of the second sub word line drivers includes a MOS transistor configured to drive a corresponding word line and comprising a source/drain connected to a second number of contacts, wherein the second number is less than the first number.

In even further embodiments, each of the second sub word line drivers may include a PMOS transistor having a gate connected to a corresponding word line enable signal, a first source/drain connected to a corresponding sub word line driving signal, and a second source/drain connected to a corresponding word line.

In yet further embodiments, each of the second sub word line drivers may further includes first and second NMOS transistors, the first NMOS transistor being connected in series between the second source/drain of the PMOS transistor and ground and including a gate connected to the corresponding word line enable signal, and the second NMOS transistor being connected between the corresponding word line and ground in parallel to the first NMOS transistor and including a gate connected to an inverted sub word line driving signal line.

In other embodiments of the disclosure, a semiconductor memory device includes a memory cell array comprising a plurality of sub cell arrays; a plurality of first word lines and a plurality of second word lines, wherein a loading of each of the first word lines is greater than a loading of each of the second word lines; a plurality of first sub word line drivers configured to drive corresponding ones of the first word lines and located between two consecutive sub cell arrays of the memory cell array; and a plurality of second sub word line drivers configured to drive corresponding ones of the second word lines and located at an upper or lower edge of the memory cell array; and word line loading matching elements connected to each of the second word lines, configured to match a loading exerted on each of the second sub word line drivers to a loading exerted on each of the first sub word line drivers.

In some embodiments, the word line loading matching element may include a capacitor.

In other embodiments, the semiconductor memory device may be a DRAM.

In still other embodiments, each of the second sub word line drivers may include a PMOS transistor configured to drive a corresponding one of the second word lines in response to a word line enable signal and a sub word line driving signal; and a first NMOS transistor having a first source/drain connected to a source/drain of the PMOS transistor and connected to the corresponding one of the second word lines and a second source/drain connected to ground and a gate configured to receive the word line enable signal.

In even other embodiments, each of the second group of sub word line drivers may further include a second NMOS transistor having a first source/drain connected to the corresponding one of the second word lines and connected to the source/drain of the PMOS transistor and a second source/drain connected to ground and a gate configured to receive an inverted sub word line driving signal.

In still other embodiments of the disclosure, a method of controlling sub word line driving in a semiconductor memory device which comprises a memory cell array comprising a plurality of first word lines and a plurality of second word lines, wherein a loading of each of the first word lines is greater than a loading of each of the second word lines, first sub word line drivers configured to drive corresponding ones of the first word lines, and second sub word line drivers configured to drive corresponding ones of the second word lines. The method includes applying a first enable signal to one of the first sub word line drivers to drive a corresponding first word line, and applying a second enable signal to one of the second sub word line drivers to drive a corresponding second word line. A slope of the second enable signal over time from a non-enable state to an enable state is less than a slope of the first enable signal from a non-enable state to an enable state over time.

In still other embodiments of the disclosure, a semiconductor memory device includes a memory cell array including a plurality of sub cell arrays disposed in a first direction and a second direction perpendicular to the first direction, each sub cell array having a plurality of memory cells; a first sub word line driver configured to activate a first word line connected to a first set of memory cells; and a second sub word line driver configured to activate a second word line connected to a second set of memory cells. A number of the second set of memory cells is less than a number of the first set of memory cells. A driving capability of the second sub word line driver is less than a driving capability of the first sub word line driver.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain principles of the disclosure. In the drawings.

DETAILED DESCRIPTION OF THE EMBODIMENTS

Figure 1:
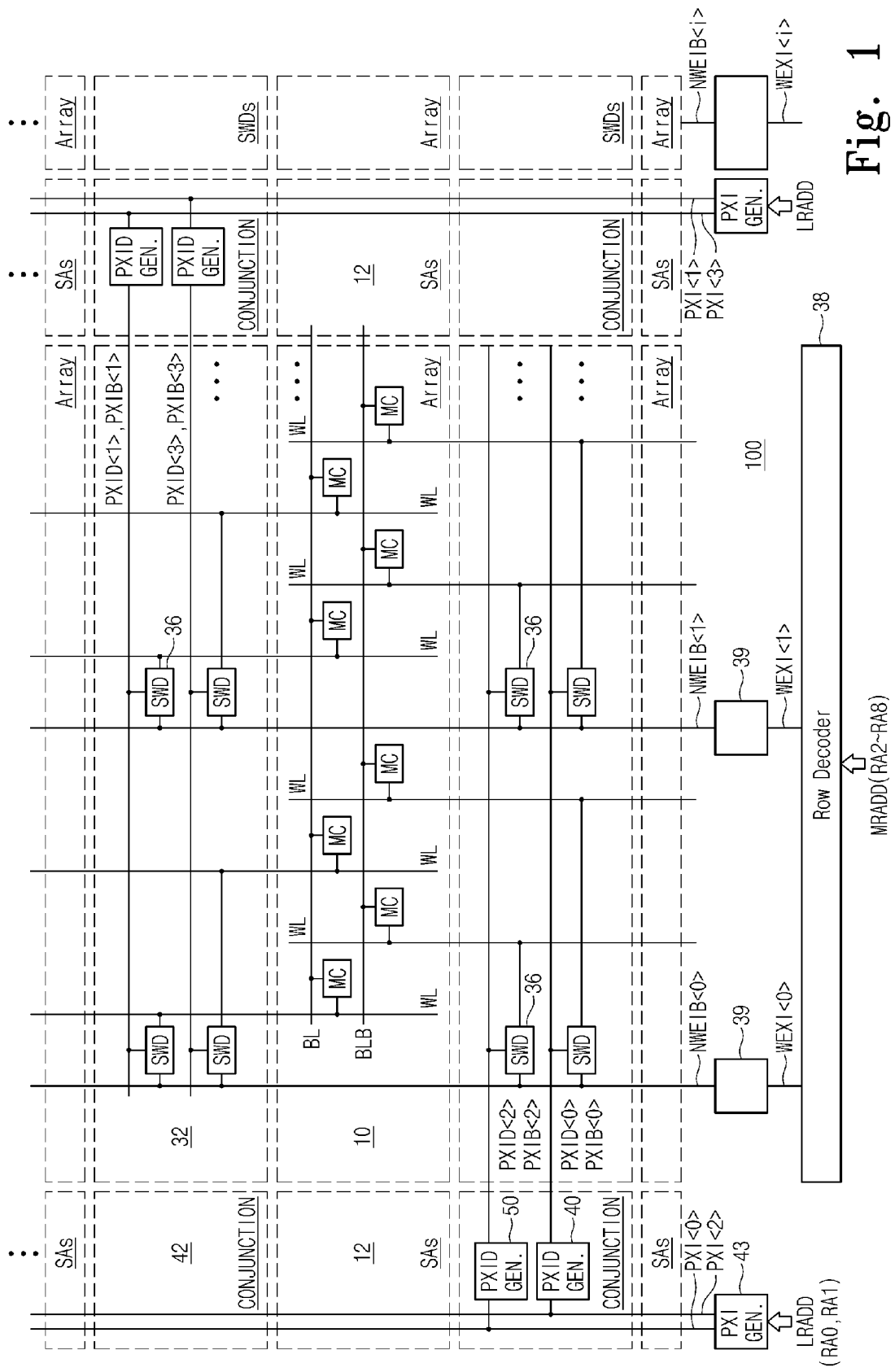
FIG. 1 is a schematic block diagram of a conventional semiconductor memory device.

Example embodiments of the present disclosure will now be described more fully through the following exemplary embodiments related to the accompanying drawings. However, the disclosure is not limited to the following embodiments but may be embodied in other forms.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements. Other words used to describe relationships between elements should be interpreted in a like fashion (i.e., "between" versus "directly between," "adjacent" versus "directly adjacent," etc.)

Moreover, the same or like reference numerals in each of the drawings represent the same or like components if possible. In some drawings, the connection of elements and lines is just represented to effectively explain technical content and may further include other elements or circuit blocks.

Note that each embodiment that is herein explained and exemplified may also include its complementary embodiment and the details of basic data access operations (including read and write operations), a pre-charge operation, a refresh operation, and an internal function circuit on a DRAM are not described in order not to make the subject matter of the disclosure ambiguous.

It will be understood that, although the terms first, second, etc. may be used herein in reference to elements of the disclosure, unless indicated otherwise, such elements should not be construed as limited by these terms. For example, a first element could be termed a second element, and a second element could be termed a first element, without departing from the scope of the present disclosure.

The terminology used herein to describe embodiments is not intended to limit the scope of the disclosure. The articles "a," "an," and "the" are singular in that they have a single referent, however the use of the singular form in the present document should not preclude the presence of more than one referent. In other words, elements of the disclosure referred to in the singular may number one or more, unless the context clearly indicates otherwise. It will be further understood that the terms such as "comprises," "comprising," "includes," and/or "including," when used herein, specify the presence of stated features, items, steps, operations, elements, and/or components, but do not preclude the presence or addition of one or more other features, items, steps, operations, elements, components, and/or groups thereof.

Unless otherwise defined, all terms (including technical and scientific terms) used herein are to be interpreted as is customary in the art to which this disclosure belongs. It will be further understood that terms in common usage should also be interpreted as is customary in the relevant art and not in an idealized or overly formal sense unless expressly so defined herein.

FIG. 1 is a schematic block diagram of a conventional semiconductor memory device.

That is, FIG. 1 has a hierarchical word line schema in order to overcome a narrow word line pitch. To this end, a core structure of a semiconductor memory device in which sub word line drivers are arranged is designed. The core structure of FIG. 1 may also be applied to the disclosure.

Referring to FIG. 1, a semiconductor memory device 100 includes a plurality of sub cell arrays 10 that configure a memory cell array, bit line sense amplifier blocks 12, sub word line driver blocks 32, a row decoder 38, word line enable drivers 39, conjunction regions 42, and lower decoding signal generating circuits 43.

The conjunction regions 42 include driving signal generating circuits 40 and 50 for supplying a voltage higher than a power supply voltage, such as a step-up voltage (e.g., Vpp), to a word line.

Each of the sub cell arrays includes a plurality of memory cells MCs.

Each MC is placed at the intersection of a word line WL being a sub word line and a bit line pair (BL/BLB), and each MC has one access transistor and a storage capacitor.

A plurality of word lines WLs may be driven by sub word line drivers 36 that are placed in sub word line driver blocks 32.

Each of the sub word line drivers 36 may be controlled by each word line enable signal NWEIB output from the word line enable drivers 39 and by sub word line driving signals PXID.

The row decoder 38 generates pre word line enable signals WEXI in response to upper row addresses MRADD, for example, RA2 to RA8. The pre word line enable signals WEXI are buffered by the word line enable driver 39 that is outside the row decoder 38. The disclosure is not limited thereto but the word line enable driver 39 may be inside the row decoder 38.

The word line enable driver 39 provides each word line enable signal NWEIB<i> to corresponding sub word line drivers 36. For example, the word line enable driver 39 receives and decodes the upper row addresses MRADD to activate one of the word line enable signals NWEIB<i>. Each activated word line enable signal NWEIB may have a level of a step-up voltage VPP.

The driving signal generating circuit 40 provides each sub word line driving signal PXID to corresponding sub word line drivers 36.

The lower decoding signal generating circuit 43 receives and decodes lower row addresses LRADD, for example RA0 and RA1 to generate four lower decoding signals PXI<j> (where j is 0 to 3).

The lower decoding signals PXI<j> drives the driving signal generating circuits 40 and 50 that are generally placed in the conjunction regions 42. The driving signal generating circuits 40 and 50 drive PXID/PXIB lines that are complementary signal lines for driving the sub word line drivers 36.

When the MC is accessed, a corresponding word line enable signal NWEIB and PXID/PXIB signals are activated. A corresponding sub word line driver (SWD) 36 drives a corresponding word line (WL) with a level of a step-up voltage VPP.

After the access operation completely ends, the sub word line driver 36 may pre-charge the sub word lines WL to a negative voltage VBB2 via a ground voltage VSS.

The pre-charge voltage level of the DRAM is generally a VBB2 voltage level. The VBB2 voltage level is higher than a back bias voltage VBB, and is lower than a ground source voltage VSS. For example, in the case of a large-scale DRAM, the VBB2 voltage level may be a level of about −0.35 V.

Here, the access operation mode of the DRAM may include a write mode and a read mode.

Figure 2:
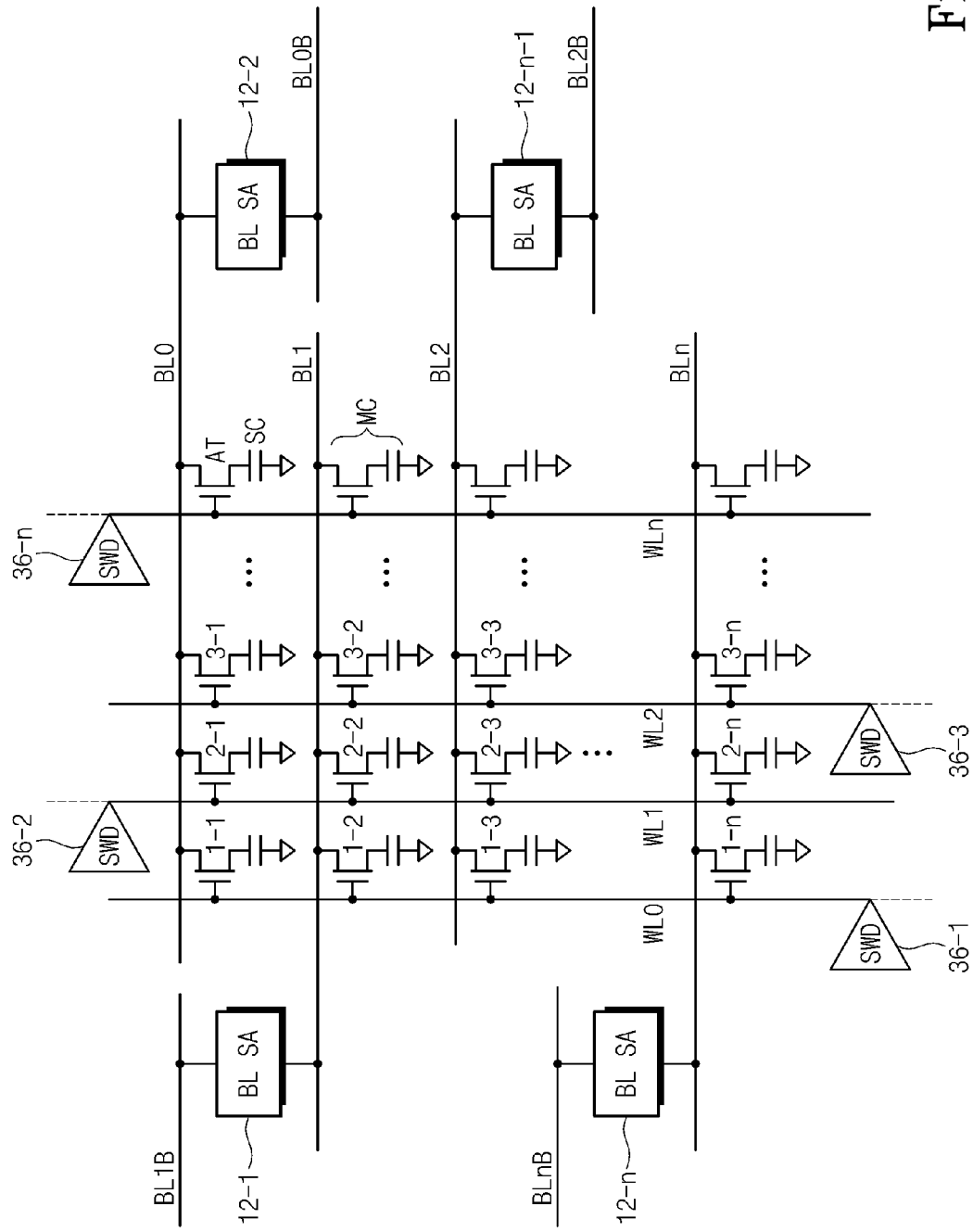
FIG. 2 shows an exemplary connection between a sub word line driver and a memory cell of FIG. 1.

FIG. 2 shows an exemplary connection between a sub word line driver and a memory cell of FIG. 1.

Referring to FIG. 2, a sub word line driver 36-1 drives a word line WL0. Moreover, a sub word line driver 36-2 drives a word line WL1. For example, the word line WL1 is driven by the sub word line driver 36-2, and if a bit line BL1 is selected, a memory cell 2-2 is accessed. In the case of a read operation, data that is stored in the memory cell 2-2 is sensed by a bit line sense amplifier 12-1.

On the other hand, the word line WL0 is driven by the sub word line driver 36-1, and if a bit line BLn is selected, a memory cell 1-n is accessed. In the case of a read operation, data that is stored in the memory cell 1-n is sensed by a bit line sense amplifier 12-n.

As such, if a word line selected by a row address is enabled in the case of a read operation of the DRAM, a bit line sense amplifier (BLSA) is driven. If the BLAS carries sensed cell data in a corresponding bit line BL, a column address is selected and the cell data is output to the outside of a chip (e.g., a semiconductor memory device 100) through an input/output (IO) line.

When the DRAM writes or read data to or from a memory cell, it basically performs a page-based operation. The page-based operation means making a word line enabled and then accessing a memory cell connected to the same word line while changing a column address. Thus, the operation of enabling a word line selected by using one row address simultaneously opens all memory cells connected to one page. One page may include, for example, 8 Kbit or 16 Kbit memory cells and the number of memory cells may vary depending on the kind of the DRAM.

Since a plurality of memory cells corresponding to one page is connected to one word line, the loading of the word line becomes greater as the number of memory cells increases. The loading of the word line means the gate loading of the word line. Since it is difficult for one word line driver to take charge of the loading of the word line, a plurality of sub word line drivers may be arranged. For example, each sub word line driver is dispersed to divide the loading of the word line.

Figure 3:
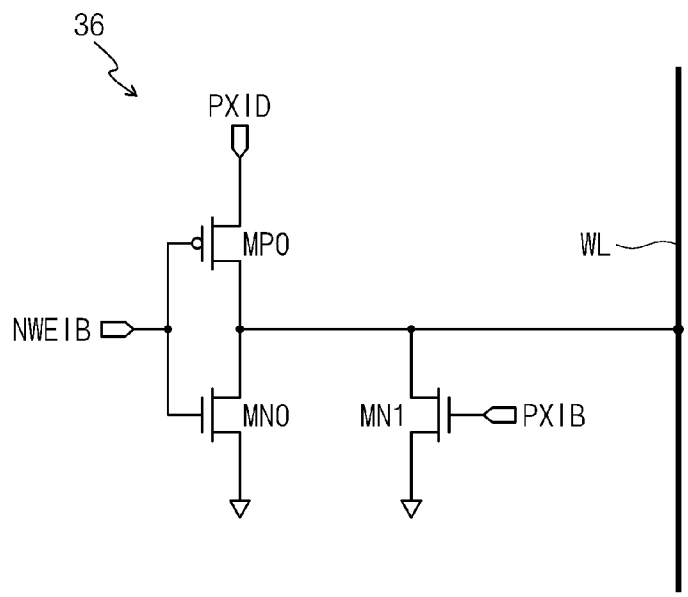
FIG. 3 is an exemplary detailed circuit diagram of a sub word line driver of FIG. 2.

FIG. 3 is an exemplary detailed circuit diagram of a sub word line driver of FIG. 2.

Referring to FIG. 3, the sub word line driver 36 includes a P-channel metal oxide semiconductor (PMOS) transistor MP0 and an N-channel metal oxide semiconductor (NMOS) transistor MN0. Moreover, the sub word line driver 36 may include a keeping-purpose NMOS transistor MN1 that is connected to a word line WL.

The PMOS transistor MP0 functioning as a pull-up transistor drives a corresponding word line in response to a word line enable signal NWEIB and a sub word line driving signal PXID.

The drain-source channel of the NMOS transistor MN0 functioning as a pull-down transistor is connected to between a drain of the PMOS transistor MP0 and ground and a gate of the NMOS transistor MN0 receives the word line enable signal NWEIB.

For the keeping-purpose NMOS transistor MN1 for keeping a corresponding word line at a ground level if the corresponding word line is not selected, its drain-source channel is connected to between a word line connected to the drain of the PMOS transistor and ground and a gate of the keeping-purpose NMOS transistor MN1 receives an inverted sub word line driving signal PXIB.

In the case of FIG. 3, although the pull-up driver of the sub word line driver (SWD) is configured as a PMOS transistor, it may be configured as an NMOS transistor depending on the kind of SWD. The keeping-purpose NMOS transistor MN1 plays a role of keeping the word line WL at a ground level when making adjacent word lines enabled. If the keeping-purpose NMOS transistor MN1 is removed, the NMOS transistor MN0 may partially take charge of a ground keeping function.

FIG. 3 is an example of a CMOS-type sub word line driver and the SWD is not limited thereto but may also be implemented as an NMOS-type sub word line driver.

Figure 4:
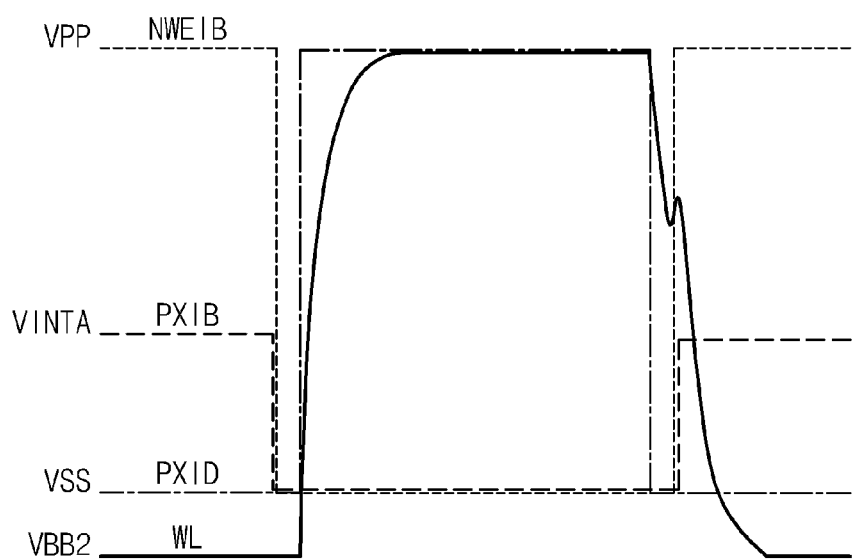
FIG. 4 is an operation timing diagram related to FIG. 3.

The inverted sub word line driving signal PXIB and the word line enable signal NWEIB may have a level of a step-up voltage VPP as shown in FIG. 4.

FIG. 4 is an operation timing diagram related to FIG. 3.

Referring to FIG. 4, a word line WL is pre-charged to a level of VBB2 lower than a level of a ground voltage VSS when being disabled. If the word line enable signal NWEIB is transited from a level of a step-up voltage VPP to a level of a ground voltage VSS and the sub word line driving signal PXIB is transited from a level of a ground voltage VSS to a level of a step-up voltage VPP, the word line WL is enabled and rises to the step-up voltage VPP level.

Here, a time taken for the enabled word line WL to rise to the step-up voltage VPP level depends on the loading of a word line that the SWD has.

As the chip size shrink of the DRAM is done, the space between WLs also continues to become narrow. Due to the coupling between WLs, memory cells connected to WLs adjacent to a selected WL are affected. Therefore, the dynamic refresh characteristic of memory cells connected to the adjacent WLs gradually becomes weak. In particular, WLs of which the loading is relatively less than that of other WLs have a great enable slope.

SWDs that are arranged at the upper edge and a lower edge of a memory cell array, in which a plurality of sub cell arrays are included, may have relatively less word line loading than SWDs that are arranged at the center of the memory cell array. Thus, when SWDs arranged at the upper and lower edges operate, word lines adjacent to a selected word line may have a relatively serious dynamic glitch. Therefore, a dynamic refresh characteristic of sub cell arrays that are placed at the edge of a memory cell array may decrease more and more.

Figure 5:
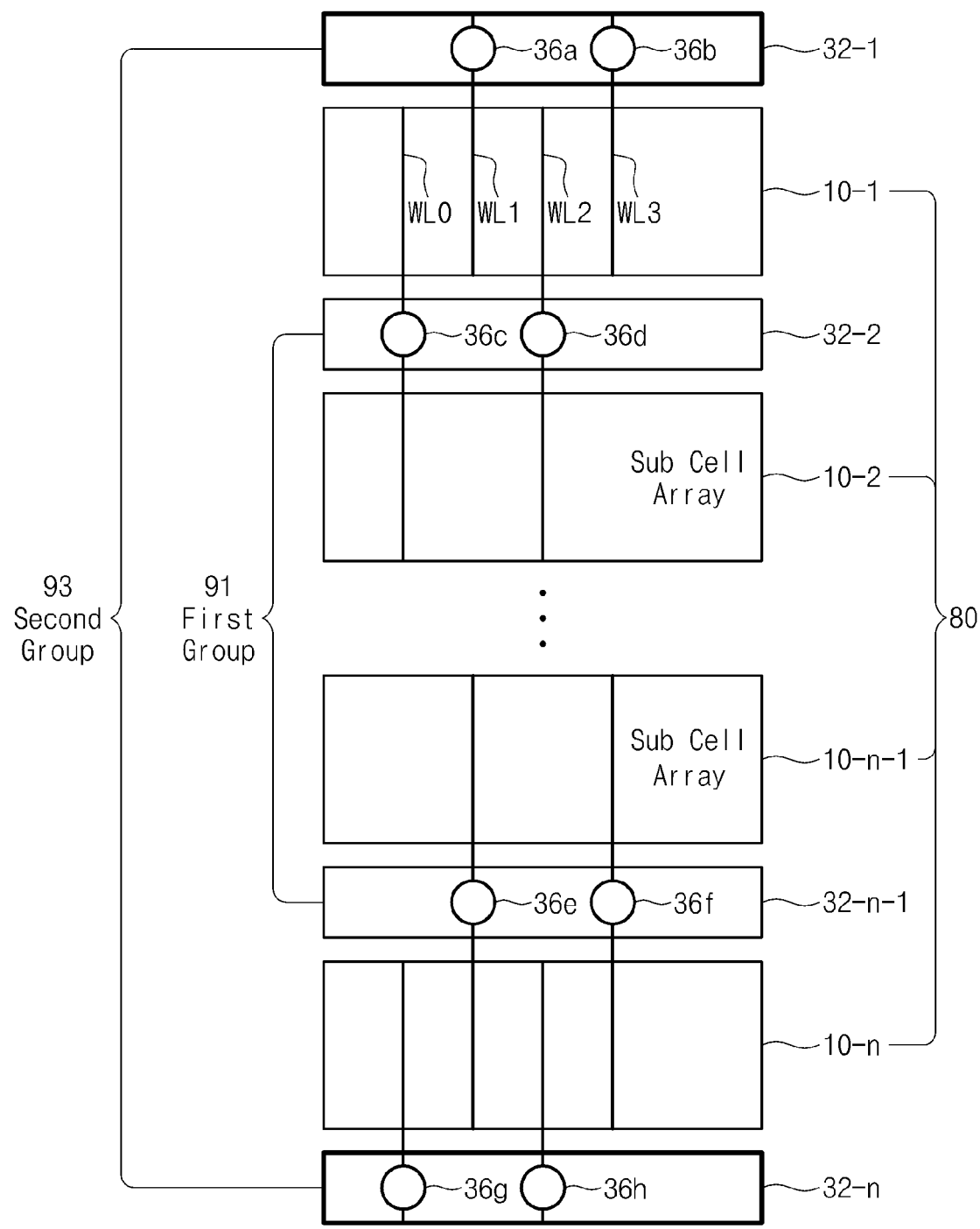
FIG. 5 is an exemplary block diagram according to a first embodiment.

In order to prevent or minimize this glitch in one embodiment, SWDs that have relatively less word line loading are designed to have a relatively limited driving capability as shown in FIG. 5.

FIG. 5 is an exemplary block diagram according to a first embodiment.

A memory cell array 80 includes a plurality of sub cell arrays 10-1 to 10-n.

A first sub word line driving group 91 includes sub word line driver blocks 32-2 to 32-n-1.

A second sub word line driving group 93 includes sub word line driver blocks 32-1 and 32-n.

Second sub word line drivers 36a, 36b, 36g, and 36h in the sub word line driver blocks 32-1 and 32-n are placed at the upper or lower edge of the memory cell array 80.

On the other hand, first sub word line drivers 36c to 36f, and 36h in the sub word line driver blocks 32-2 to 32-n-1 are placed between the upper and lower edges of the memory cell array 80, namely at the center. For example, each of the first sub word line drivers 36c to 36f, and 36h is located between two consecutive sub cell arrays.

Each of the first sub word line drivers 36c and 36d has a first driving capability according to the word line loading of corresponding ones 10-1 and 10-2 of the sub cell arrays.

Each of the second sub word line drivers 36a and 36b has a second driving capability different from the first driving capability according to the word line loading of a corresponding one 10-1 of the sub cell arrays.

Each of the first sub word line drivers 36e and 36f has a first driving capability according to the word line loading of corresponding ones 10-n-1 and 10-n of the sub cell arrays.

Each of the second sub word line drivers 36g and 36h has a second driving capability different from the first driving capability according to the word line loading of a corresponding one 10-n of the sub cell arrays.

Here, the second driving capability may be set to be limited than the first driving capability in order to enhance a dynamic refresh characteristic.

For example, when the first sub word line driver 36c is compared to the second sub word line driver 36a, the word line loading of the former is done through sub cell arrays 10-1 and 10-2 and thus becomes two times the word line loading of the latter.

Thus, in order to enhance the dynamic refresh characteristic, the driving capability of the second sub word line driver 36a having relatively less word line loading is designed as half the driving capability of the first-sub word line driver 36c.

To that end, a driving transistor of the second sub word line driver 36a is implemented differently from a normal driving transistor of the first sub word line driver 36c in shape and in size as shown in FIGS. 11 to 14.

Figure 6:
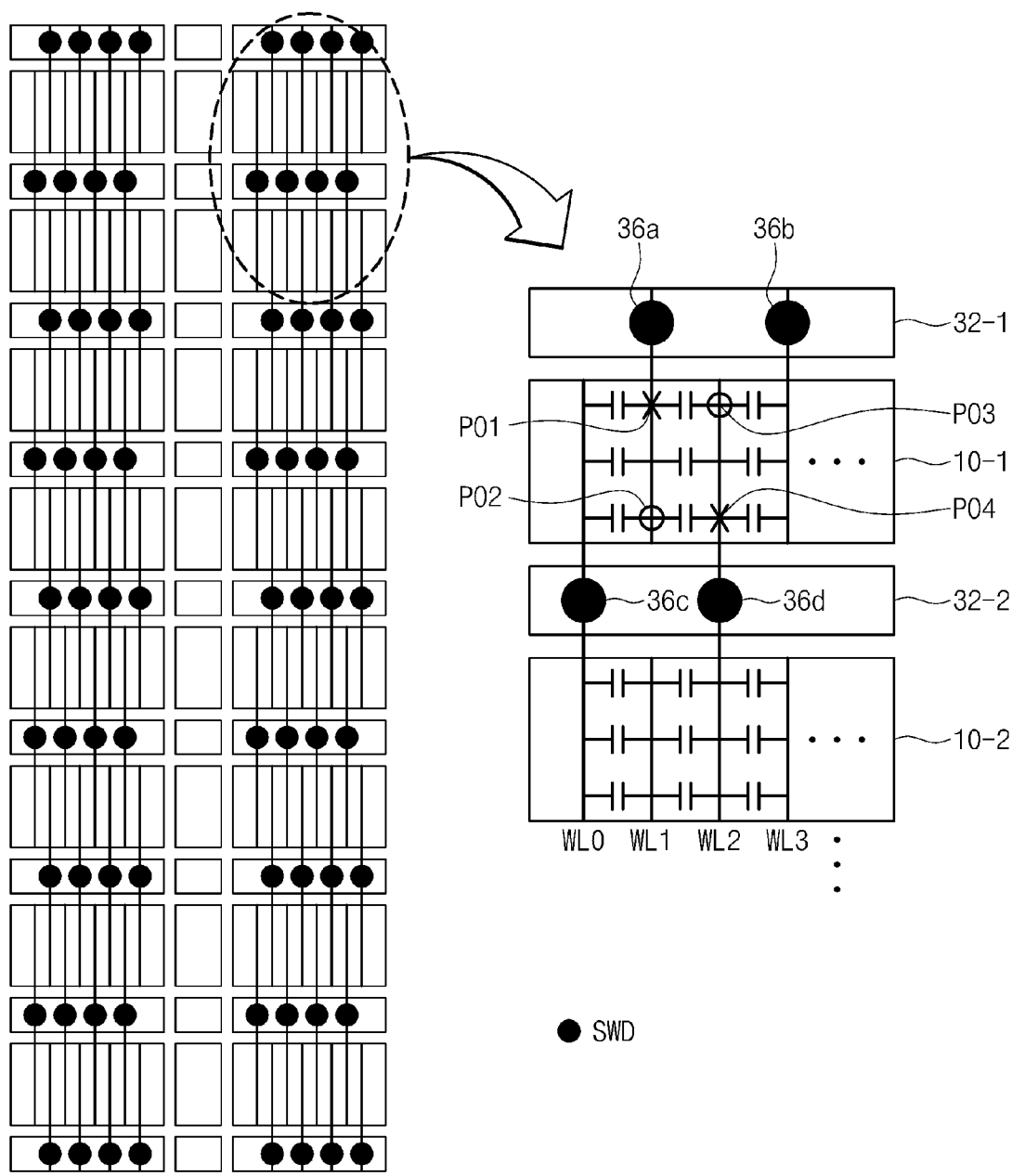
FIG. 6 is a diagram for explaining the word line loading deviation of a sub word line driver.
Figure 7:
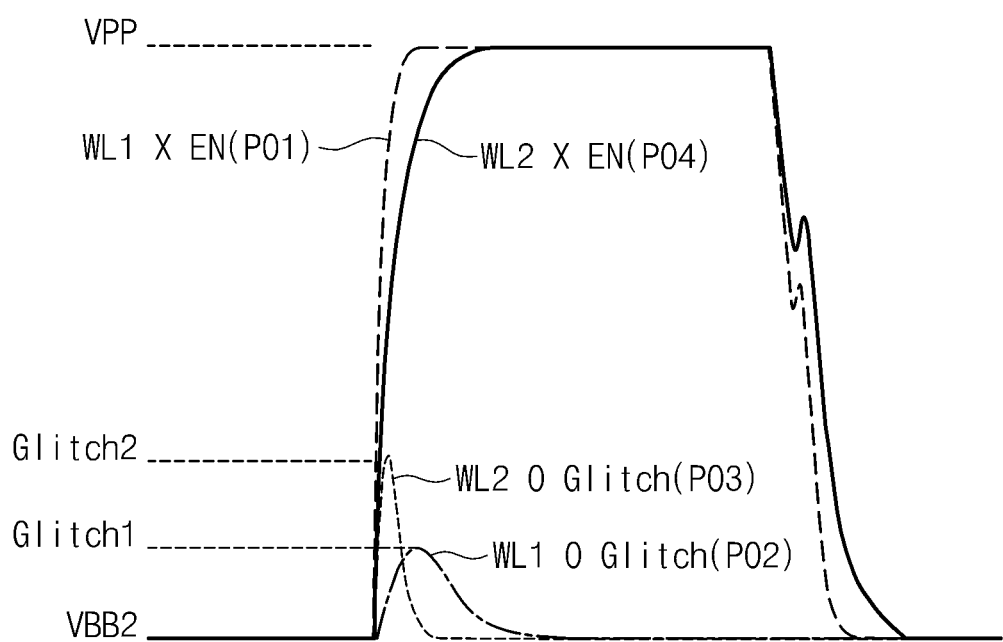
FIG. 7 is an operation timing diagram related to FIG. 6.

FIG. 6 is a diagram for explaining the word line loading deviation of a conventional sub word line driver. FIG. 7 is an operation timing diagram related to FIG. 6

Figure 8:
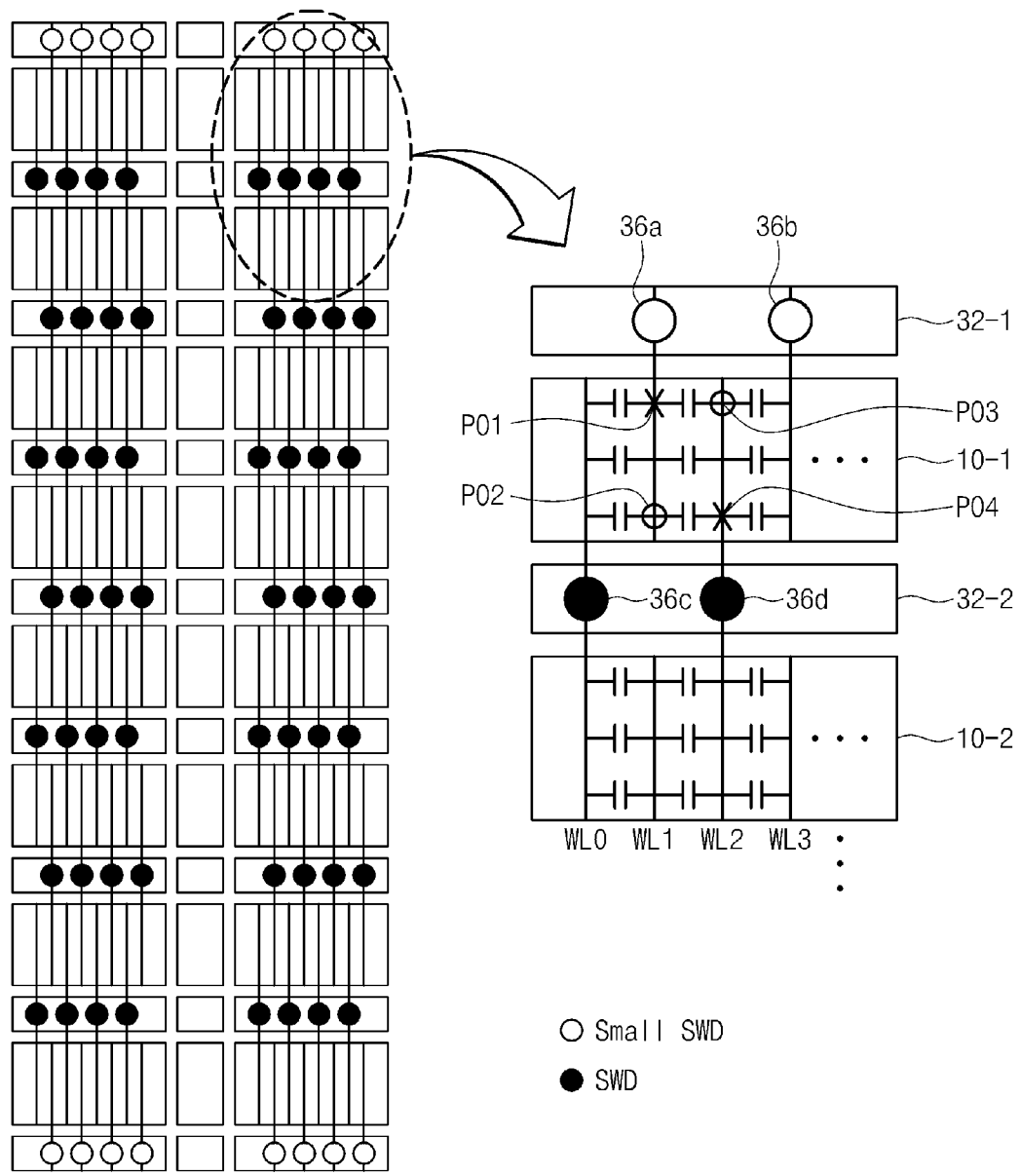
FIG. 8 is a diagram for explaining the word line loading matching of a sub word line driver according to FIG. 5 according to one embodiment.

FIGS. 6 and 7 are used for helping the detailed understanding of a decrease in dynamic refresh characteristic, and are presented to make readers thoroughly understand the exemplary implementations of FIGS. 5 and 8.

Referring to FIG. 6, a plurality of SWDs is dispersed in a memory cell array to drive corresponding word lines within a preset time. In order to make the layout of the SWDs efficient, SWDs that drive adjacent word lines are arranged under and over the sub cell array in zigzag way. If the SWDs are arranged in this way, most SWDs have word line loading in the shape of spreading out both arms around a SWD. However, the SWDs that are arranged at the top edge and at the bottom edge of a corresponding row at the interval of two WLs have word line loading in the shape of spreading out only one arm. As a result, a few SWDs that are arranged at the top and bottom edges of a row have the half of the word line loading of other SWDs. In this case, the driving speeds of WLs at the top and bottom edges of a row are faster than those of other WLs.

Referring to an expanded view in FIG. 6, if a SWD 36d drives a WL2, the WL enable speed of a WL2 X position PO4 becomes fast and then dynamic WL noise corresponding to a glitch1 occurs at an adjacent WL1 0 position PO2 as shown in FIG. 7.

On the other hand, if a SWD 36a drives WL1, the WL enable speed of a WL1 X position PO1 becomes fast as shown on the graph PO1 in FIG. 7, and in this case, since WL loading is less, the WL enable speed of the WL1 X position PO1 becomes faster than enable speed of a WL2 X position PO4. In this case, dynamic WL noise corresponding to a glitch2 occurs at an adjacent WL2 0 position PO3 as shown in FIG. 7. The glitch2 may be more severe than the glitch1 as shown in FIG. 7.

If the dynamic noise of a unselected WL is great, there is a high probability that data stored in a memory cell is lost by a leakage current that flows in an access transistor, and thus decreasing dynamic coupling noise related to adjacent word lines of a selected word line of the DRAM is directly connected to improving the dynamic refresh characteristic of the DRAM.

FIG. 8 is a diagram for explaining the word line loading matching of a sub word line driver according to FIG. 5 according to one embodiment.

Figure 9:
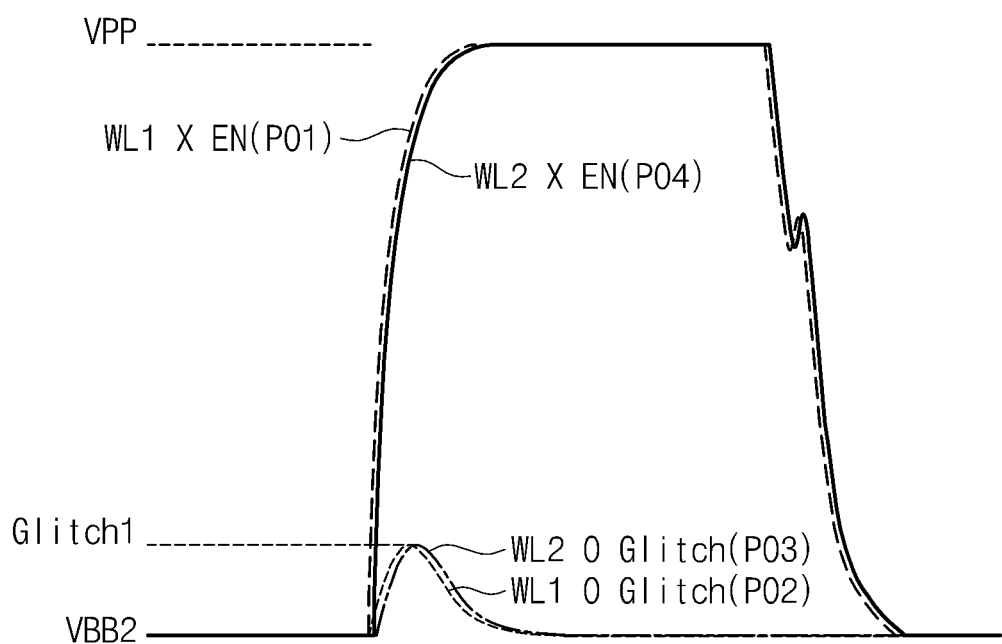
FIG. 9 is an operation timing diagram related to FIG. 8.

FIG. 9 is an operation timing diagram related to FIG. 8.

In FIG. 8, SWDs 36c and 36d in the sub word line driver blocks 32-2 correspond to the first sub word line drivers of FIG. 5. Moreover, SWDs 36a and 36b in the sub word line driver blocks 32-1 correspond to second sub word line drivers of FIG. 5.

Since the SWD 36a has less word line loading than the SWD 36d, it is designed to have a limited word line driving capability.

As a result, SWDs at the top and bottom edges relatively shrink in word line driving capability. The driving capability shrinks by adjusting the driving capability of the second SWD to become equal or similar to the WL enable speed of the first SWD.

Thus, as shown in FIG. 9, the enable speed of a WL2 X position PO4 becomes equal to the enable speed of a WL1 X position PO1. Thus, both the glitch noise of a WL1 0 position PO2 and the glitch noise of a WL2 0 position PO3 become a level of a glitch1. Thus, the dynamic refresh characteristic of WL 0 positions PO3 and PO2 that have the greatest glitch noise is improved.

If only a pull-up driver in each of the SWDs 36a and 36b (i.e., second SWDs) shrinks, there are effects in dynamic refresh noise improvement and chip size shrink, and a pull-down driver in each of the SWDs 36a and 36b may also shrink to have the same WL disable slope as that of each of the SWDs 36c and 36d (i.e., first SWDs).

For a keeping driver in an SWD, only a minimum size may be used in most cases. If the loading capacitor of a WL that becomes a victim becomes small, a glitch is likely to increase by coupling. Thus, a keeping transistor may also be size-adjusted as well.

Adjusting an enable slope for word lines connected to each of the second SWDs may be implemented in various ways.

Firstly, reducing the driving capability of each of the second SWDs may be considered.

In particular, decreasing the width of a driving transistor, decreasing the number of fingers of the driving transistor, decreasing the contact size of the driving transistor, and decreasing the number of contacts of the driving transistor may be practiced.

FIGS. 10 to 14 are presented to explain various example methods of reducing the driving capability of each of the second SWDs.

Figure 10:
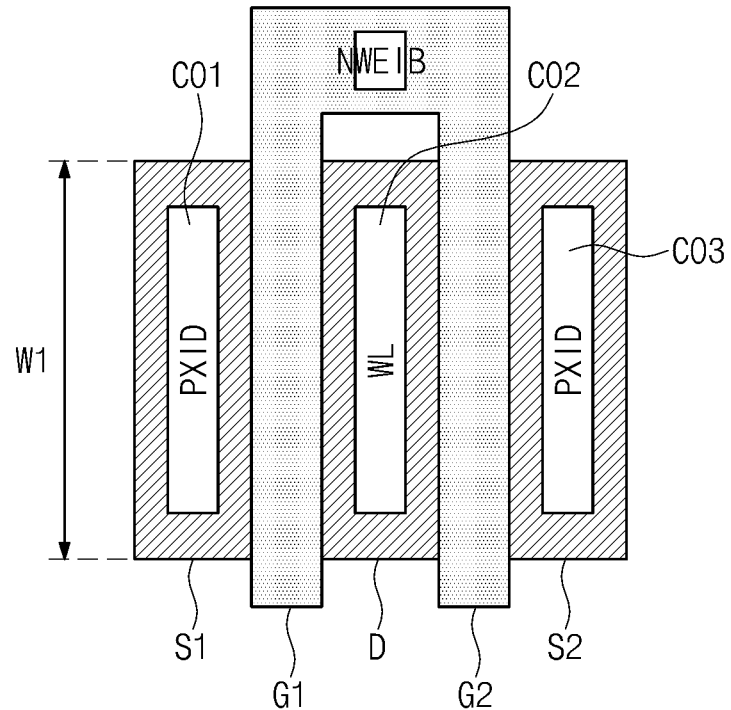
FIG. 10 is a view of a reference transistor that configures a sub word line driver.

FIG. 10 is a view of a reference transistor that configures a sub word line driver.

Referring to FIG. 10, the PMOS transistor MPO in the first SWDs is formed as a gate region including two fingers G1 and G2, a drain region D, and source regions S1 and S2. Reference numerals C01 to C03 indicate contact regions respectively, and reference numeral W1 means the channel width of the transistor.

Since the PMOS transistor MPO in the first SWDs is designed to be suitable for the loading of a plurality of word lines, it may be referred to as a normal transistor.

Figure 11:
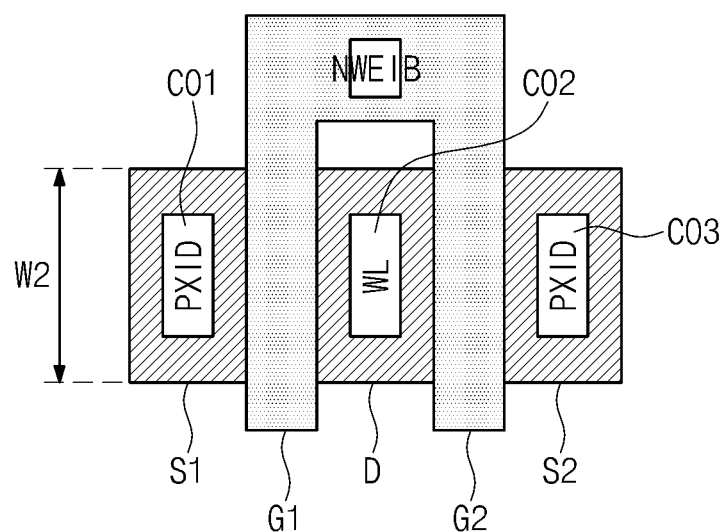
FIG. 11 is an exemplary view of a transistor of which the width is narrower than that of the transistor of FIG. 10.

FIG. 11 is an exemplary view of a transistor of which the width is narrower than that of the transistor of FIG. 10.

Referring to FIG. 11, the width W2 of the MOS transistor that configures each of the second SWDs is implemented to be narrower than the width W1 of the MOS transistor that configures each of the first SWDs. Thus, the driving capability of each of the second SWDs shrinks.

Figure 12:
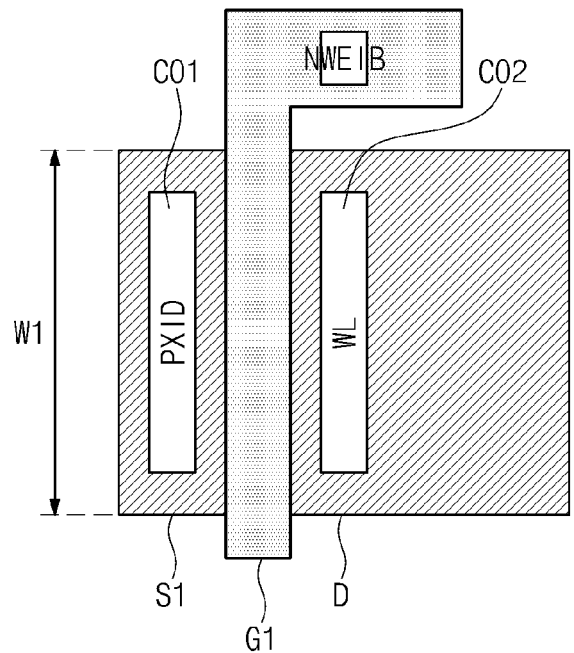
FIG. 12 is an exemplary view of a transistor of which the number of fingers is smaller than that of the transistor of FIG. 10.

FIG. 12 is an exemplary view of a transistor of which the number of fingers is smaller than that of the transistor of FIG. 10.

Referring to FIG. 12, the number of fingers of the MOS transistor that configures each of the second SWDs is smaller than that of the MOS transistor that configures each of the first SWDs, as compared to FIG. 10. Thus, the driving capability of each of the second SWDs shrinks as compared to FIG. 10.

Figure 13:
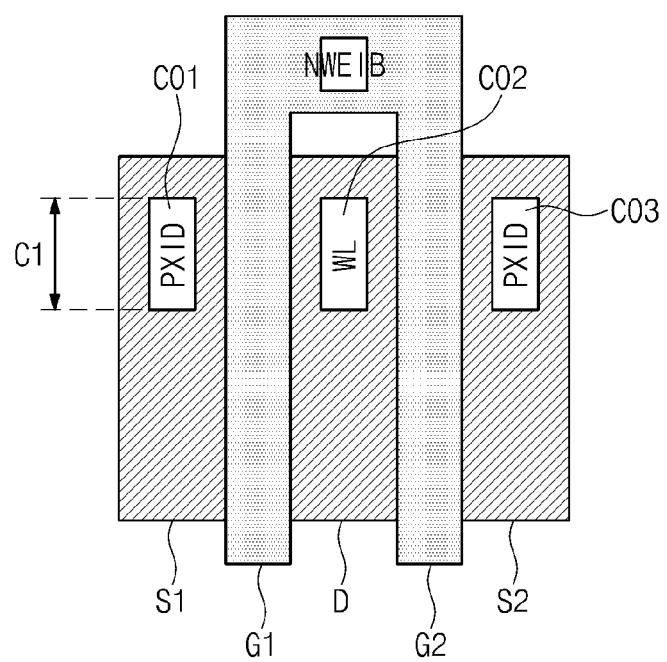
FIG. 13 is an exemplary view of a transistor of which the contact size is smaller than that of the transistor of FIG. 10.

FIG. 13 is an exemplary view of a transistor of which the contact size is smaller than that of the transistor of FIG. 10.

Referring to FIG. 13, the contact size of the MOS transistor that configures each of the second SWDs is smaller than that of the MOS transistor that configures each of the first SWDs. Thus, the driving capability of each of the second SWDs shrinks as compared to FIG. 10.

Figure 14:
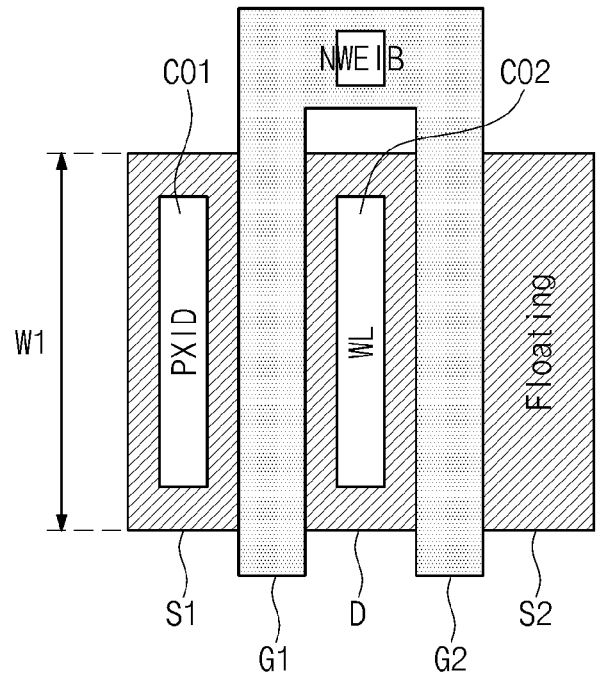
FIG. 14 is an exemplary view of a transistor of which the number of contacts is smaller than that of the transistor of FIG. 10.

FIG. 14 is an exemplary view of a transistor of which the number of contacts is smaller than that of the transistor of FIG. 10.

Referring to FIG. 14, the number of contacts of the MOS transistor that configures each of the second SWDs may be smaller than that of the MOS transistor that configures each of the first SWDs. Thus, the driving capability of each of the second SWDs shrinks as compared to FIG. 10.

Figure 15:
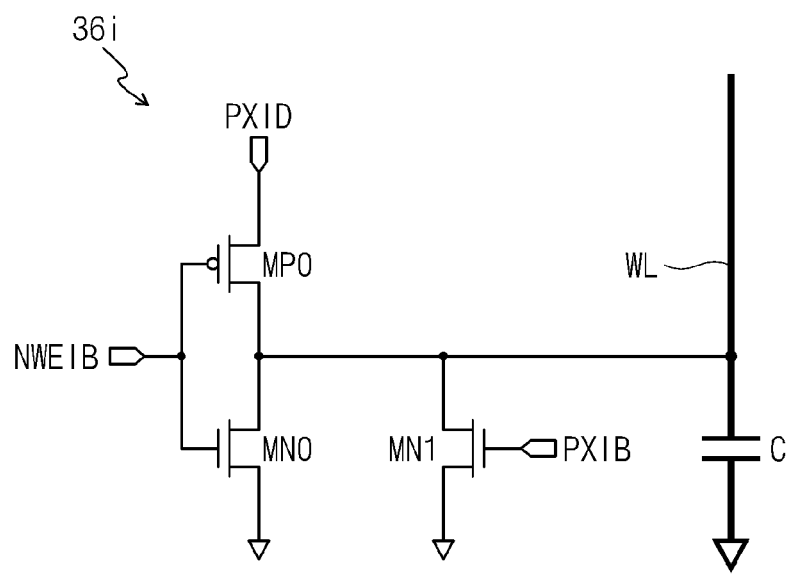
FIG. 15 is a circuit diagram of a sub word line driver according to a second embodiment.

FIG. 15 is a circuit diagram of a sub word line driver according to a second embodiment.

Referring to FIG. 15, a second SWD 36i is the same as the SWD of FIG. 3 in circuit configuration except that a capacitor C, a word line loading matching element is further installed.

The capacitor C plays a role of intentionally increasing the word line loading so that the word line loading of the second SWD 36i is the same as word line loading of each of the first SWDs. However, in this embodiment, a chip size may be undesirably increased.

As a result, in the case of FIG. 15, in order to match the word line loading of each of the second sub word line drivers with the word line loading of each of the first sub word line drivers, each of the second sub word line drivers include a word line loading matching element between a word line and ground.

Figure 16:
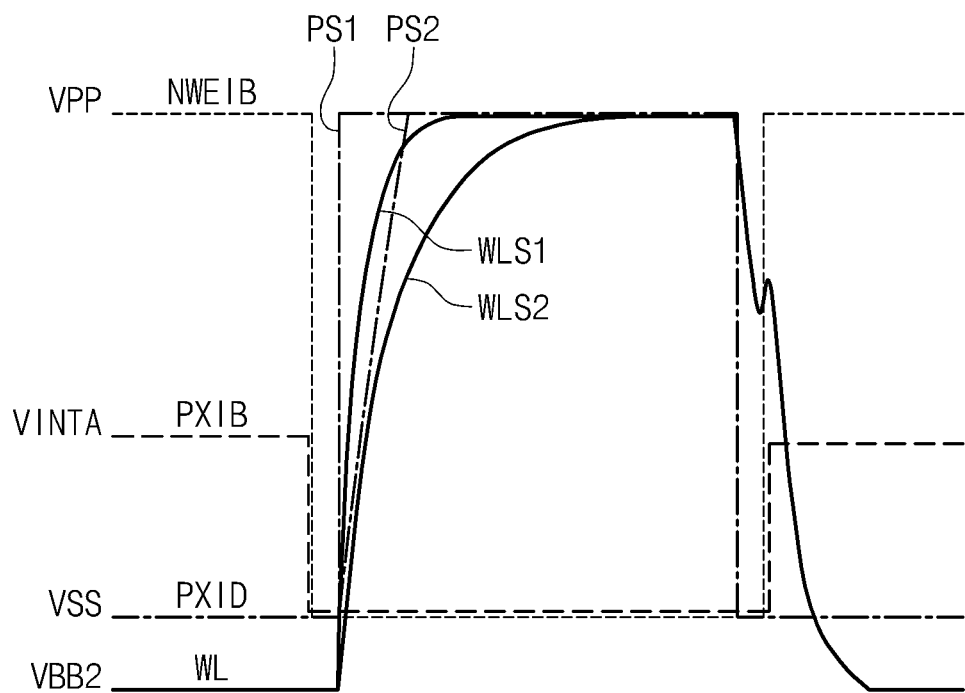
FIG. 16 shows the slope adjustment of an input signal for driving a sub word line according to a third embodiment.

FIG. 16 shows the slope adjustment of an input signal for driving a sub word line according to a third embodiment.

As a third method of adjusting an enable slope for word lines connected to the second SWDs, there is a method of making the slope of input signals applied to each of the second SWDs gentle.

It may be recognized that word line enable depends on a PXID signal in the case of FIG. 4. Thus, if the slope of the PXID signal is intentionally adjusted to be gentle, the enable slope of word lines connected to the second SWDs is also adjusted accordingly.

In FIG. 16, if the slope of the PXID signal is changed from the waveform PS1 to from the waveform PS2, the enable slope of a word line is also changed from the waveform WLS1 to the waveform WLS2.

As a result, when driving the word lines connected to the second sub word line drivers, the slope of an input signal for driving a word line decreases to apply the input signal to the second sub word line drivers, compared to when driving the word lines connected to the first sub word line drivers.

On the other hand, in addition to adjusting the slope of the PXID signal, adjusting the slope of the NWEIB signal may also be considered.

Figure 17:
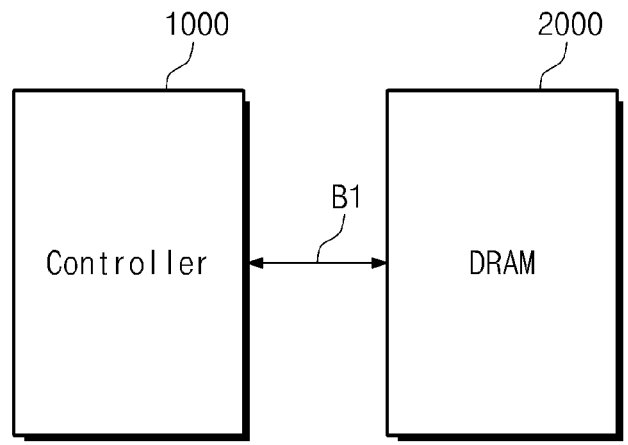
FIG. 17 is an exemplary block diagram of a memory system according to certain embodiments.

FIG. 17 is an exemplary block diagram of a memory system according to certain embodiments.

Referring to FIG. 17, the memory system may include a controller 1000 and a DRAM 2000. The DRAM 2000 may be connected to the controller 1000 through a system bus B1 and receive data, addresses, and commands. Moreover, the DRAM 2000 may provide data read from a memory cell to the controller 1000 through the system bus B1.

The controller 1000 may be connected to a host (not shown) through a predetermined interface.

The DRAM 2000 may have a circuit configuration as shown in FIG. 8.

Thus, since the DRAM 2000 has sub word line drivers that have different driving capabilities according to the word line loading of a sub cell array in the memory system, the dynamic refresh characteristic is improved.

Therefore, the operation performance of the memory system that includes the DRAM 2000 is enhanced.

Figure 18:
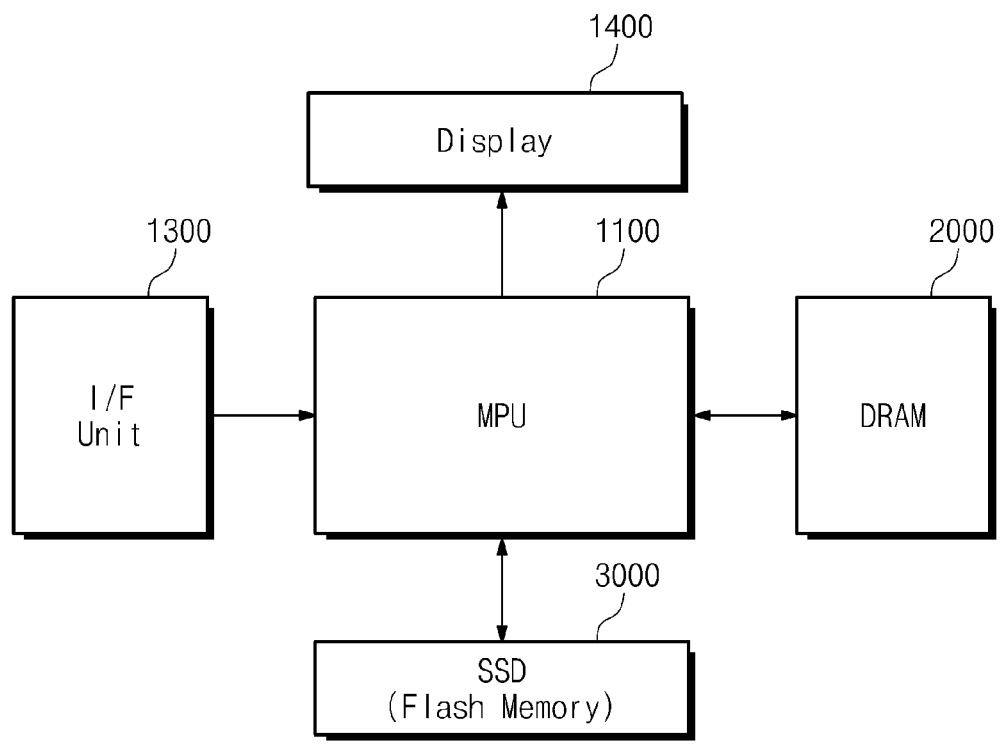
FIG. 18 is an exemplary block diagram of a mobile device according to certain embodiments.

FIG. 18 is an exemplary block diagram of a mobile device according to certain embodiments.

Referring to FIG. 18, a mobile device such as a notebook or a portable electronic device may include a micro processing unit (MPU) 1000, a display 1400, an interface unit 1300, a DRAM 2000, and a solid state drive (SSD) 3000.

The MPU 1100, the DRAM 2000, and the SSD may be manufactured or packaged as one chip depending on the situation. As a result, the DRAM 2000 and the flash memory 3000 may be embedded in the mobile device.

In a case where the mobile device is a portable communication device, a modem and a transceiver that perform the transmission/reception and modulation/demodulation of communication data may be connected to the interface unit 1300.

The MPU 1100 controls the overall operations of the mobile device according to a preset program.

The DRAM 2000 is connected to the MPU 1100 and may function as the buffer memory or main memory of the MPU 1100. Since the DRAM 2000 may have sub word line drivers that have different driving capabilities according to the word line loading of a sub cell array as shown in FIG. 8 or FIG. 15, a dynamic refresh characteristic is improved. Moreover, a dynamic refresh characteristic may be improved in the DRAM 2000 by adjusting the slope of the sub word line driving signal or word line enable signal applied to a sub word line driver according to the word line loading of a sub cell array as shown in FIG. 16. Therefore, the mobile operation performance of the mobile device that includes the DRAM 2000 is improved.

The flash memory 3000 may be NOR or NAND type flash memory.

The display 1400 is a liquid crystal element having a backlight, a liquid crystal element having a light emitting diode (LED) source, or an organic light-emitting diode (OLED) element, and may have a touch screen. The display 1400 functions as an output element that displays characters, numbers, and images such as pictures in color.

Although the mobile device is mainly described on a mobile communication device, it may function as a smart card by adding or removing components if necessary.

The mobile device may be connected to an external communication device through a separate interface. The communication device may be a digital versatile disc (DVD), a player, a computer, a set top box (STB), a game console, and a digital camcorder.

Although not shown, it is obvious to an ordinary person skill in the art that the mobile device may further include an application chipset, a camera image processor (CIS), and a mobile DRAM.

A chip that forms the mobile device may be mounted by using the packages of various forms. For example, the chip may be packaged as Package on Package (PoP), Ball grid arrays (BGAs), Chip scale packages (CSPs), Plastic Leaded Chip Carrier (PLCC), Plastic Dual In-Line Package (PDIP), Die in Waffle Pack, Die in wafer Form, Chip On Board (COB), Ceramic Dual In-Line Package (CERDIP), Plastic Metric Quad Flat Pack (MQFP), Thin Quad Flatpack (TQFP), Small Out line (SOIC), Shrink Small Outline Package (SSOP), Thin Small Out line (TSOP), Thin Quad Flatpack (TQFP), System In Package (SIP), Multi Chip Package (MCP), Wafer-level Fabricated Package (WFP), Wafer-Level Processed Stack Package (WSP).

For example, FIG. 18 employs a flash memory as an example but non-volatile storages of various types may be used.

The non-volatile storage may store data information that has various data forms such as texts, graphics, and software codes. The non-volatile storage may be implemented as, for example, an Electrically Erasable Programmable Read-Only Memory (EEPROM), a flash memory, a Magnetic RAM (MRAM), a Spin-Transfer Torque MRAM), a Conductive bridging RAM (CBRAM), a FeRAM (Ferroelectric RAM), a Phase change RAM (PRAM RAM) referred to as an Ovonic Unified Memory (OUM), a Resistive RAM (RRAM or ReRAM), a Nanotube RRAM, a Polymer RAM (PoRAM), a Nano Floating Gate Memory (NFGM), a holographic memory a molecular electronics memory device, or an insulator resistance change memory.

Figure 19:
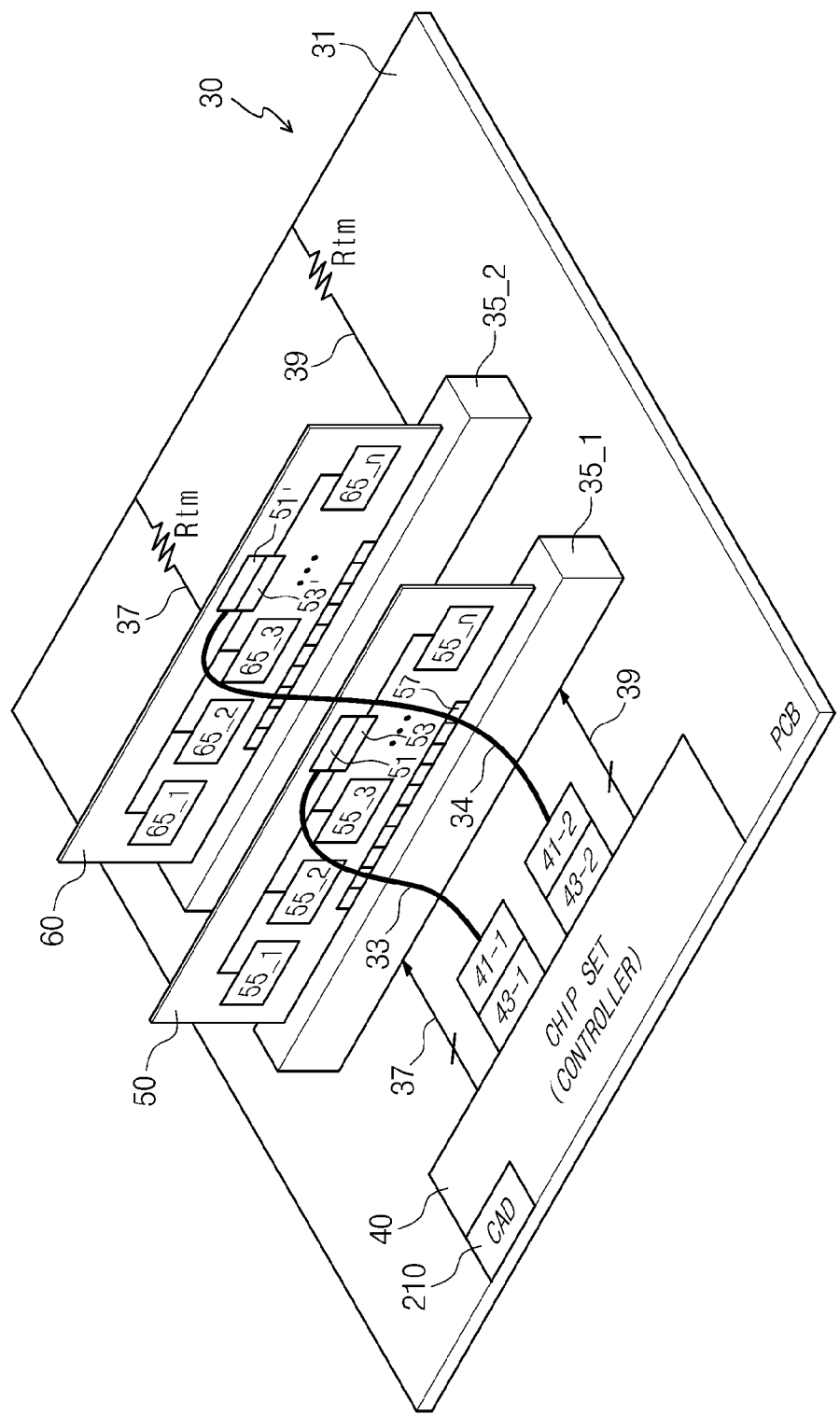
FIG. 19 is an exemplary block diagram of an optical I/O schema according to certain embodiments.

FIG. 19 is an exemplary block diagram of an optical I/O schema according to certain embodiments.

Referring to FIG. 19, a memory system 30 employing a high-speed optic I/O includes a chipset 40 as a controller loaded on a PCB substrate 31 and memory modules 50 and 60. The memory modules 50 and 60 are respectively inserted into slots 35_1 and 35_2 that are installed on the PCB substrate 31. The memory module 50 includes a connector 57, DRAM memory chips 55_1 to 55_n, an optical I/O input unit 51, and an optical I/O output unit 53.

The optical I/O input unit 51 may include a photoelectric conversion element for converting an applied optical signal into an electrical signal, such as a photodiode. Thus, an electrical signal output from the photoelectric conversion element is transmitted to the memory module 50. The optical I/O output unit 53 may include an electrophotic conversion element for converting an electrical signal output from the memory module 50 into an optical signal, such as a laser diode. If necessary, the optical I/O output unit 53 may further include a light modulator for modulating a signal output from a light source.

An optical cable 33 takes charge of optical communication between the optical I/O input unit 51 of the memory module 50 and an optical transmission unit 41_1 of the chipset 40. The optical communication may have a bandwidth of Gbps. The memory module 50 may receive signals or data applied from the signal lines 37 and 39 of the chipset 40 through a connector 57, and perform high-speed data communication with the chipset 40 through the optical cable 33. On the other hand, resistors Rtm that are installed on lines 37 and 39 that are not described are termination resistors.

Even in the case of a memory system 30 that employs an optical I/O structure as shown in FIG. 19, the DRAM memory chips 55_1 to 55_n according to the disclosed embodiments may be equipped.

Thus, since the DRAM memory chips 55_1 to 55_n may have sub word line drivers that have different driving capabilities according to the word line loading of a sub cell array in the memory system 30 as shown in FIG. 8 or FIG. 15, a dynamic refresh characteristic is improved. Moreover, a dynamic refresh characteristic may be improved in the DRAM memory chips 55_1 to 55_n by adjusting the slope of the sub word line driving signal or word line enable signal applied to a sub word line driver according to the word line loading of a sub cell array as shown in FIG. 16. Therefore, the operation performance of the memory system that includes the DRAM memory chips 55_1 to 55_n is improved.

In FIG. 19, the chipset 40 may have a concentrated access detector 210. The concentrated access detector 210 generates a concentrated access detection signal if the number of times that addresses that are frequently applied are applied exceeds a preset threshold value.

The chipset 40 may prevent data from becoming corrupted or alleviate data corruption if the concentrated access detection signal is generated. The data is held by memory cells of adjacent memory regions adjacent to a specific memory region.

For example, if a specific word line, a specific bit line, or a specific memory block of a volatile semiconductor memory such as a DRAM is accessed in a concentrated way, memory cell data may become corrupted. That is, the memory cells of adjacent word lines adjacent to a specific word line, adjacent bit lines adjacent to a specific bit line, or adjacent memory blocks adjacent to a specific memory block may lose holding cell data due to the intense access. Thus, solving or avoiding such address concentration is needed to prevent or alleviate the loss of cell data.

If the DRAM memory chips 55_1 to 55_n of the memory modules 50 and 60 are accessed on a memory page basis, on a column basis, or on a bank basis, the concentrated access detector 210 monitors access concentration.

If it is assumed that the memory system of FIG. 19 is SSD, the DRAM memory chips 55_1 to 55_n may be used as a user data buffer.

Figure 20:
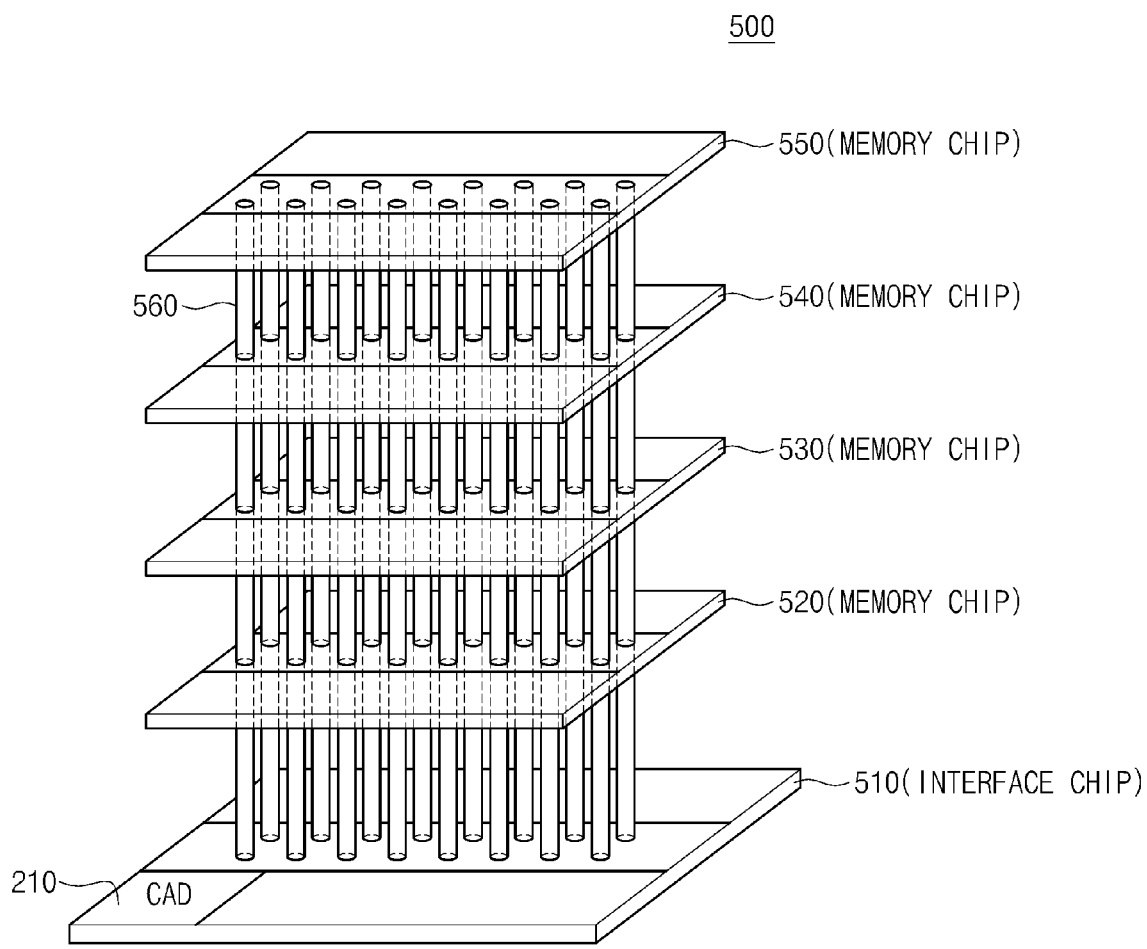
FIG. 20 is an exemplary block diagram of an application related to a through silicon via (TSV) according to certain embodiments.

FIG. 20 is an exemplary block diagram of an application related to through substrate vias (or through silicon vias (TSVs)) according to certain embodiments.

Referring to the structure of a stacked memory device 500 of FIG. 20, a plurality of memory chips 520 to 550 is vertically stacked on an interface chip 50. Here, a plurality of through silicon vias 560 is formed by passing through the memory chips 520 to 550. A 3D stack package type memory device 500 that is formed by vertically stacking the plurality of memory chips on the interface chip 510 by using a TSV technology stores massive data and has a structure helpful for a high speed, low consumption power, and compactness.

Since the interface chip 510 may include the concentrated access detector 210 even in the case of the stacked memory device of FIG. 20, preventing or alleviating the corruption of data for the DRAMs in the plurality of memory chips 520 to 550 may be efficiently performed.

In the stacked memory device as shown in FIG. 20, DRAMs according to the inventive concept may be equipped. Thus, since the DRAM that configures the plurality of memory chips 520 to 550 may have sub word line drivers that have different driving capabilities according to the word line loading of a sub cell array as shown in FIG. 8 or FIG. 15, a dynamic refresh characteristic is improved. Moreover, a dynamic refresh characteristic may be improved in the DRAM by adjusting the slope of the sub word line driving signal or word line enable signal applied to a sub word line driver according to the word line loading of a sub cell array as shown in FIG. 16. Thus, the data input and output performance of the stacked memory device is improved.

Figure 21:
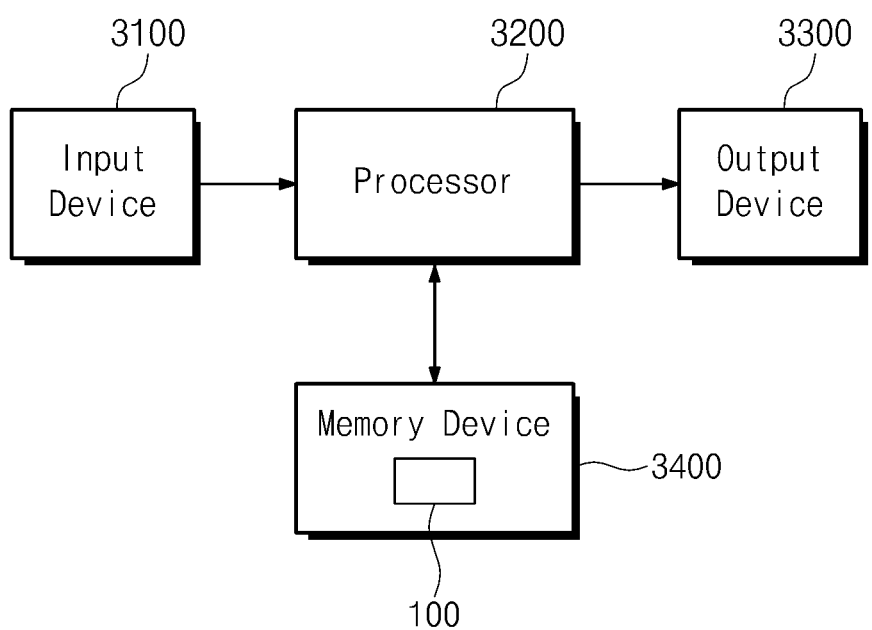
FIG. 21 is an exemplary block diagram of an electronic system according to certain embodiments.

FIG. 21 is an exemplary block diagram of an electronic system according to certain embodiments.

As shown in FIG. 21, the electronic system includes an input device 3100, an output device 3300, a processor 3200, and a memory device 3400. The memory device 3400 includes a DRAM 100 as shown in FIG. 1. Moreover, note that the DRAM 100 may be integrated into any one of the input device 3100, the output device 3300, and the processor 3200.

Even in the case of FIG. 21, since the DRAM 100 may have sub word line drivers that have different driving capabilities according to the word line loading of a sub cell array as shown in FIG. 8 or FIG. 15, a dynamic refresh characteristic is improved.

Figure 22:
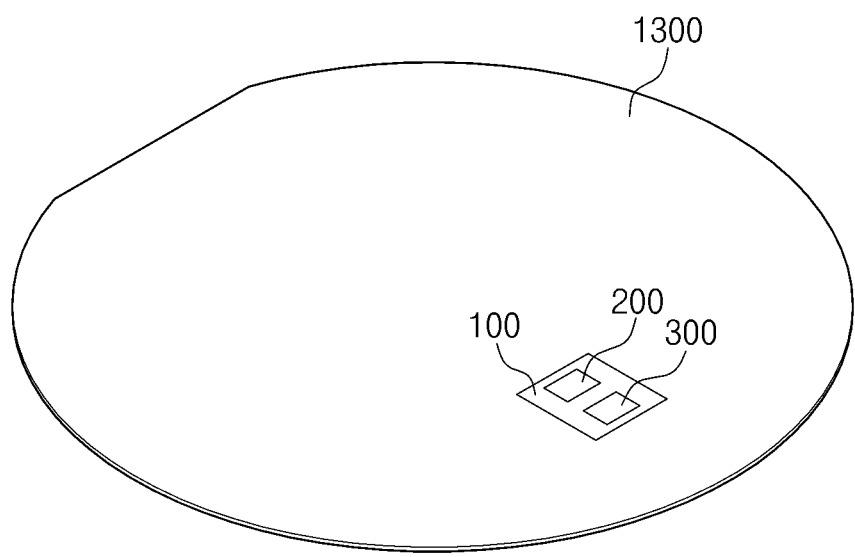
FIG. 22 is an exemplary block diagram of a semiconductor wafer according to certain embodiments.

FIG. 22 is an exemplary block diagram of a semiconductor wafer according to certain embodiments.

Referring to FIG. 22, the memory device 100 such as the above-described DRAM is processed on a semiconductor wafer 1300. It should be understood that the memory device 100 may also be processed on other various semiconductor substrates. As described in the specification, since the memory device 100 may have sub word line drivers that have different driving capabilities according to the word line loading of a sub cell array as shown in FIG. 8 or FIG. 15, a dynamic refresh characteristic is improved. Moreover, a dynamic refresh characteristic may be improved in the memory device 100 by adjusting the slope of the sub word line driving signal or word line enable signal applied to a sub word line driver according to the word line loading of a sub cell array as shown in FIG. 16.

While the present disclosure has been particularly shown and described with reference to exemplary embodiments thereof, it will be understood by those of ordinary skill in the art that various changes in form and details may be made therein without departing from the spirit and scope of the present disclosure as defined by the following claims. For example, it is possible to adjust the driving capability of a sub word line driver or adjust the slope of level of applied driving signals by changing, adding, or removing the circuit configuration or arrangement in the drawings without departing from the technical spirit of the present disclosure in other cases.

Moreover, the disclosure is mainly described with respect to a DRAM and DRAM memory cells. However, the inventive concept is not limited thereto but may be widely applied to other semiconductor memory devices such as an electrically erasable programmable read-only memory (EEPROM), a flash memory, a phase change random access memory (PRAM), a resistance random access memory (RRAM), a nano floating gate memory (NFGM), a polymer random access memory (PoRAM), a magnetic random access memory (MRAM), a ferroelectric random access memory (FRAM), etc.

What is claimed is:

1. A semiconductor memory device comprising:
   a memory cell array comprising a plurality of sub cell arrays, a plurality of first word lines and a plurality of second word lines, wherein a loading of each of the first word lines is greater than a loading of each of the second word lines;
   a plurality of first sub word line drivers each connected to drive a corresponding one of the plurality of first word lines, wherein each of the first sub word line drivers has a first driving capability; and
   a plurality of second sub word line drivers each connected to drive a corresponding one of the plurality of second word lines, wherein each of the second sub word line drivers has a second driving capability different from the first driving capability.

2. The semiconductor memory device of claim 1, wherein the second driving capability is less than the first driving capability.

3. The semiconductor memory device of claim 2, wherein each second sub word line driver is located at an upper or lower edge of the memory cell array.

4. The semiconductor memory device of claim 3, wherein each first sub word line driver is located between two consecutive sub cell arrays of the memory cell array.

5. The semiconductor memory device of claim 2, wherein each of the first and second sub word line drivers includes a MOS transistor having a source/drain connected to a corresponding word line, and
   wherein a width of the MOS transistor of each second sub word line driver is less than a width of the MOS transistor of each first sub word line driver.

6. The semiconductor memory device of claim 2, wherein each of the first and second sub word line drivers includes a MOS transistor having a source/drain connected to a corresponding word line, and
   wherein the MOS transistor of each of the first sub word line drivers has a first number of fingers and MOS transistor of each of the second sub word line drivers have a second number of fingers, wherein the second number is less than the first number.

7. The semiconductor memory device of claim 2, wherein each of the first and second sub word line drivers includes a MOS transistor configured to drive a corresponding word line and comprising a source/drain connected to a contact, and
   wherein a size of the contact connected to the MOS transistor of each of the second sub word line drivers is smaller than a size of the contact connected to the MOS transistor of each of the first sub word line drivers.

8. The semiconductor memory device of claim 2, wherein each of the first sub word line drivers includes a MOS transistor configured to drive a corresponding word line and comprising a source/drain connected to a first number of contacts, and
   wherein each of the second sub word line drivers includes a MOS transistor configured to drive a corresponding word line and comprising a source/drain connected to a second number of contacts, wherein the second number is less than the first number.

9. The semiconductor memory device of claim 8, wherein a part of the source/drain of the MOS transistor of each second sub word line driver is not connected to any contact.

10. The semiconductor memory device of claim 2, wherein each of the second sub word line drivers comprises a PMOS transistor having a gate connected to a corresponding word line enable signal, a first source/drain connected to a corresponding sub word line driving signal, and a second source/drain connected to a corresponding word line.

11. The semiconductor memory device of claim 10, wherein each of the second sub word line drivers further comprises first and second NMOS transistors, the first NMOS transistor being connected in series between the second source/drain of the PMOS transistor and ground and including a gate connected to the corresponding word line enable signal, and the second NMOS transistor being connected between the corresponding word line and ground in parallel to the first NMOS transistor and including a gate connected to an inverted sub word line driving signal line.

12. A semiconductor memory device comprising:
    a memory cell array comprising a plurality of sub cell arrays, a plurality of first word lines and a plurality of second word lines, wherein a loading of each of the first word lines is greater than a loading of each of the second word lines;
    a plurality of first sub word line drivers configured to drive corresponding ones of the first word lines and located between two consecutive sub cell arrays of the memory cell array;
    a plurality of second sub word line drivers configured to drive corresponding ones of the second word lines and located at an upper or lower edge of the memory cell array; and
    word line loading matching elements connected to each of the second word lines, configured to match a loading exerted on each of the second sub word line drivers to a loading exerted on each of the first sub word line drivers.

13. The semiconductor memory device of claim 12, wherein the word line loading matching element includes a capacitor.

14. The semiconductor memory device of claim 13, wherein the semiconductor memory device is a DRAM.

15. The semiconductor memory device of claim 13, wherein each of the second sub word line drivers comprises:
    a PMOS transistor configured to drive a corresponding one of the second word lines in response to a word line enable signal and a sub word line driving signal; and
    a first NMOS transistor having a first source/drain connected to a source/drain of the PMOS transistor and connected to the corresponding one of the second word lines and a second source/drain connected to ground and a gate configured to receive the word line enable signal.

16. The semiconductor memory device of claim 15, wherein each of the second sub word line drivers further comprises a second NMOS transistor having a first source/drain connected to the corresponding one of the second word lines and connected to the source/drain of the PMOS transistor and a second source/drain connected to ground and a gate configured to receive an inverted sub word line driving signal.

17. The semiconductor memory device of claim 12, wherein a number of memory cells connected to each of the first word lines is greater than a number of memory cells connected to each of the second word lines.

18. A method of controlling sub word line driving in a semiconductor memory device which comprises a memory cell array comprising a plurality of first word lines and a plurality of second word lines, wherein a loading of each of the first word lines is greater than a loading of each of the second word lines, first sub word line drivers configured to drive corresponding ones of the first word lines, and second sub word line drivers configured to drive corresponding ones of the second word lines, the method comprising:
- applying a first enable signal to one of the first sub word line drivers to drive a corresponding first word line; and
- applying a second enable signal to one of the second sub word line drivers to drive a corresponding second word line,
- wherein a slope of the second enable signal over time from a non-enable state to an enable state is less than a slope of the first enable signal from a non-enable state to an enable state over time.

19. A semiconductor memory device comprising:
- a memory cell array including a plurality of sub cell arrays disposed in a first direction and a second direction perpendicular to the first direction, each sub cell array having a plurality of memory cells;
- a first sub word line driver configured to activate a first word line connected to a first set of memory cells; and
- a second sub word line driver configured to activate a second word line connected to a second set of memory cells,
- wherein a number of the second set of memory cells is less than a number of the first set of memory cells, and
- wherein a driving capability of the second sub word line driver is less than a driving capability of the first sub word line driver.

20. The semiconductor memory device of claim 19, wherein the first sub word line driver is disposed between two consecutive sub cell arrays in the first direction and the second sub word line driver is disposed at an edge of the memory cell array in the first direction.

* * * * *